United States Patent
Woodall et al.

(10) Patent No.: US 6,677,278 B1
(45) Date of Patent: Jan. 13, 2004

(54) PB-BI-SR-CA-CU-OXIDE POWDER MIX WITH ENHANCED REACTIVITY AND PROCESS FOR ITS MANUFACTURE

(75) Inventors: Lee Woodall, Griesheim (DE); Ru-Shi Liu, Hsinschu (TW); Ya-Wei Hsueh, Taipei (TW); Wolfgang Wilhelm Schmahl, Bochum (DE); Sebastian Raeth, Bochum (DE)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 10/048,399

(22) PCT Filed: Jul. 29, 2000

(86) PCT No.: PCT/EP00/06315
§ 371 (c)(1),
(2), (4) Date: Jun. 6, 2002

(87) PCT Pub. No.: WO01/12557
PCT Pub. Date: Feb. 22, 2001

(30) Foreign Application Priority Data

Jul. 30, 1999 (EP) .............................................. 99115007

(51) Int. Cl.$^7$ ........................ H01L 39/24; H01B 12/00; C01G 29/00; C01F 1/00; G01B 13/34
(52) U.S. Cl. ............. 505/121; 252/519.13; 252/519.15; 252/518.1; 505/121; 505/125; 505/501; 505/510; 505/782; 29/599
(58) Field of Search .................................. 505/100, 121, 505/125, 425, 500, 510, 737, 782; 423/583, 604, 617; 252/519.13, 519.15; 29/599

(56) References Cited

U.S. PATENT DOCUMENTS

| | | | | |
|---|---|---|---|---|
| 5,082,688 A | * | 1/1992 | Agostinelli et al. | 505/470 |
| 6,219,901 B1 | * | 4/2001 | Podtburg et al. | 29/599 |
| 2002/0016265 A1 | * | 2/2002 | Rupich et al. | 505/510 |

FOREIGN PATENT DOCUMENTS

| | | | | |
|---|---|---|---|---|
| EP | WO 8902871 | * | 4/1989 | C01G/3/00 |
| EP | 0681989 A1 | * | 11/1995 | C01B/13/34 |

OTHER PUBLICATIONS

Woodall et al, "Quantitative Phase Analysis of PBSCCO 2223 Precursor Powders—an XRD/Rietveld Refinement Study", Superconductors Science and Technology, 2002, vol. 15, No. 4 (Apr.), pp 543–554; ISSN 0953–2048.*
Chemical Abstracts, Sep. 27, 1999, abstract No. 178063, vol. 131, No. 13, pp. 1939–1945.

* cited by examiner

Primary Examiner—Yogendra N. Gupta
Assistant Examiner—Kallambella Vijayakumar
(74) Attorney, Agent, or Firm—Millen, White, Zelano & Branigan, P.C.

(57) ABSTRACT

An Oxide Precursor Powder from the Pb—Bi—Sr—Ca—Cu—O 2223 System can be produced by heat treating powder, produced using the Spray Pyrolysis Process as described in: GB2210605 or EP0681989 between 700° C. and 850° C. in an atmosphere containing between 0.1% and 21% $O_2$. Heat Treatment of the pyrolysis powder under controlled conditions produces a powder with a particular phase composition, that is highly homogeneous and has a small particle size distribution, that is inherently more reactive than powders heat treated in the same way but produced using other processes.

8 Claims, 6 Drawing Sheets

Figure 1A:
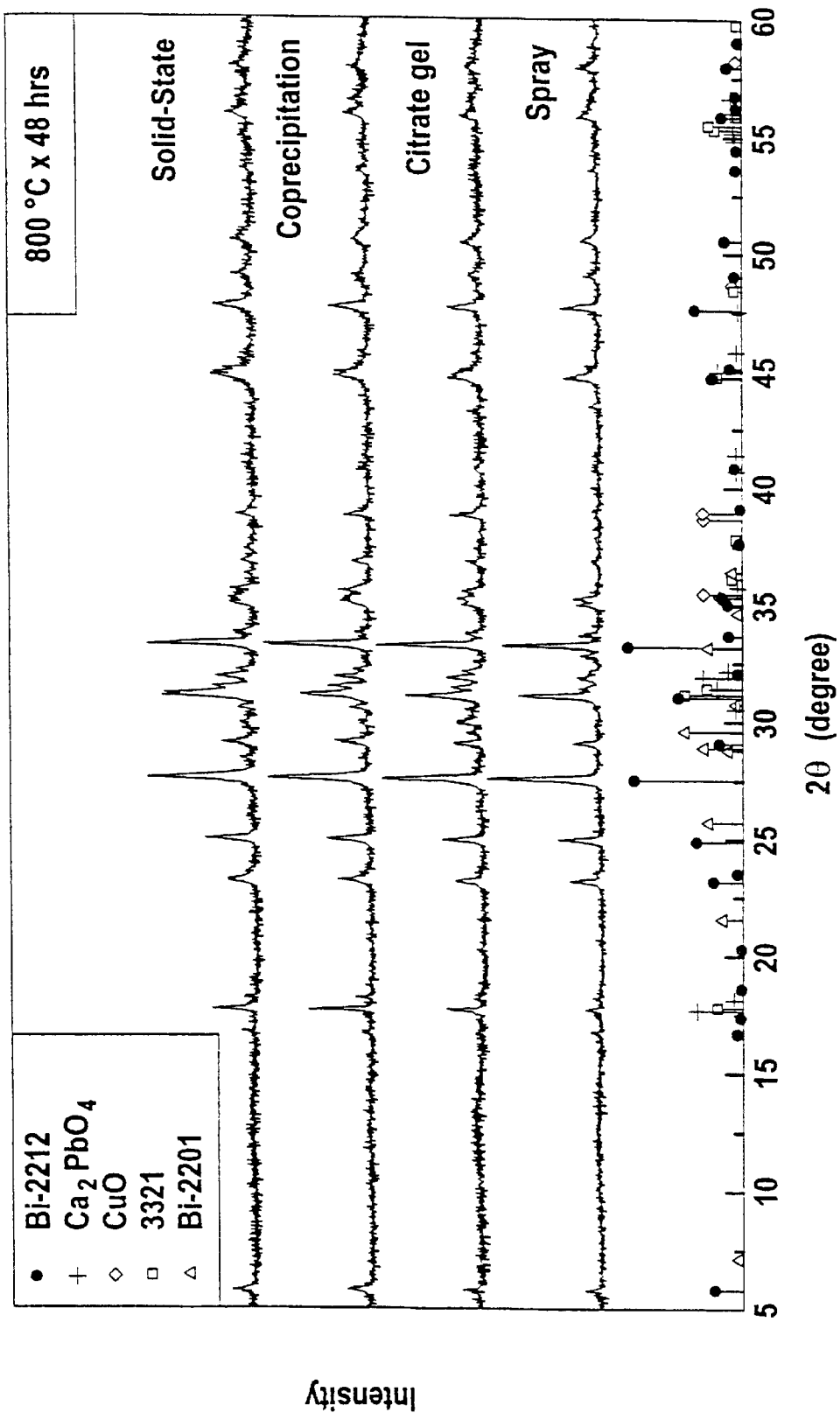

PB-BI-SR-CA-CU-OXIDE POWDER MIX WITH ENHANCED REACTIVITY AND PROCESS FOR ITS MANUFACTURE

This invention relates to mixed oxide powder mixtures with enhanced reactivity as presursor materials for superconductors and to a process for its manufacture.

In special the present invention relates to precursor powders produced by spray pyrolysis that are then further heat treated such that they show considerable advantage in forming the Pb—Bi—Sr—Ca—Cu—O 2-2-2-3 superconducting phase over powders produced using other routes.

Superconductors are materials that loose all resistance to the flow of electricity below a critical transition temperature. Today superconducting metals and alloys are being used in a variety of commercial applications in Electronics and Medicine, for example the use of Low Temperature Superconducting Magnets in MRI (Magnetic Resonance Imaging) systems and as Electromagnets in High Energy Physics. The discovery of Superconductivity in the Ceramic Oxide System La—Sr—Cu—O system in 1986 (ref Berdnoz und Müller: Z. Physik B 64, 189, 1986) sparked renewed activity in the search for Super-conductivity at temperatures above those only then accessible with liquid helium. Within one year the 'High Temperature' Y—Ba—Cu—Oxide system (HTS) had been discovered in which the critical transition temperature had been raised above 77K (ref Chu: EP341266, 12.01.87), allowing liquid nitrogen to be used as a coolant. Many new High Temperature Superconductors have been discovered and evaluated for potential commercial application over the last ten years, but still the two systems regarded as having the greatest chance of commercial success in the near future are those systems discovered the first, the 'Re'(Rare Earth) —Ba—Cu Oxides and those based on the Bi—Sr—Ca—Cu Oxide Sytem.

The current market share for the High Temperature Superconductors within the Superconductor Industry is small at ca 3% (15M) of the total (ref BCC Market Research Study: GB-106R, The Superconductor Industry). This is because these Materials and Systems are still in the development and prototype stage, real market growth expected only after the systems have proved themselves to have advantage both in cost and quality (performance and environmental impact). The largest market segment for HTS is currently in elec- tronics and communications where they are used as microwave filters and resonators. Other segments where both the Re—Ba—Cu—O and Bi—Sr—Ca—Cu—O systems are under development include Current Leads to provide low loss energy supply to LTS systems, Magnetic Energy Storage devices able to supply energy when routine supply has been interrupted, Fault Current Limiters to reduce energy supply to a load during a fault, Magnet Systems, Power Cables,Motors and Generators. Wires and Tapes, for use in a number of the afore-mentioned applications, continue to be developed based on the Pb—Bi—Sr—Ca—Cu—O 2-2-2-3 system. In competition, the IBAD and RaBITs Process using the Re—Ba—Cu Oxides are also now attracting more attention (X. D. Wu et al, Applied Physics Letters 65, 1961, 1994).

The current prefered method to manufacture Pb—Bi—Sr—Ca—Cu—O 2-2-2-3 tapes for energy applications is to use the oxide Powder in Tube method (PIT Method). This process involves the packing of a precursor form into a silver alloy tube that is then subject to repeated mechanical deformation and high temperature thermal treatments. The final product consists of thin filaments of sintered ceramic within the silver-alloy host. During the heat treatment process the precursor form within the silver matrix undergoes conversion to the desired superconducting phase, the Pb—B—Sr—Ca—Cu—O 2-2-2-3 phase (ref EP0330305, Jan. 19, 1989; U.S. Pat. No. 4,880,771, Feb. 26, 1988). The quality of the final tapes is dependent upon many process parameters, including the intrinsic nature of the precursor powder, the density of the powder preform, the nature of the silver alloy sheath, the reduction on passing through the drawing die, pressing versus rolling, number of filaments, the calcination atmosphere, the calcination temperature, the calcination time and the heating and cooling cycles. As the processes within the tape during the heat treatments involve chemical conversion to the prefered 2-2-2-3 phase, the intrinsic properties of the precursor powder determine, to a degree, the choice of processing parameters. The conversion of the powder to the 2-2-2-3 phase is thought to proceed via one of two routes, either by growth of the 2-2-2-3 phase from a liquid phase (Flukiger et al, SST, 10, A68, 1997) or by intercalation of calcium and copper oxide layers into the 2-2-1-2 crystal grains already present in the precursor powder (J Jiang, S Abel, SST 10,1997, 678 and references therein).The role of the deformation step in the processing of these tapes is to both texture the grains and to increase the density within the ceramic core. However this step can also introduce cracks and defects in the ceramic which have to be healed during the thermal processing. The liquid phase, produced by melting of particular phases, for example induced through reaction with calcium plumbate, is thought to accelerate phase conversion as well as to both heal these microcracks and remove unwanted grain bounday phases. Therefore the relative amounts of these phases need to be controlled, both in the original precursor itself and through the processing stages to supply enough liquid phase to the system and thereby produce clean grained, well aligned 2-2-2-3 grains at the end of the process. One of the first stages during this conversion is the incorporation of lead from the plumbate phases into the Bi-2-2-1-2 grains. This can be followed by monitoring the change in the phase composition of the material, by for example X-Ray Diffraction. As the reaction proceeds, the calcium plumbate levels decrease as lead enters into the Bi-2-2-1-2 grains. This also results in a change of the lattice type that can be followed with X-Ray Diffraction, changing from a tetragonal unit cell to an orthorhombic one. Too much calcium plumbate is thought to be detrimental to the formation of well textured 2-2-2-3 grains. Excess calcium plumbate can give rise to the growth of undesirable alkaline earth phases during the processing which cannot be removed at a later stage, can disrupt the layering of the 2-2-2-3 grains during mechanical deformation and can decompose, releasing gas, that is trapped momentarily within the silver alloy sheath and results in irrecoverable deformation of the tape. It is also thought that too little calcium plumbate is detrimental in PIT processing because not enough liquid phase can then be supplied during the heat processing stages to heal all the microcracks, clean all the grain boundaries and facilitate the final conversion of residual phases to 2-2-2-3. The final reaction step involves conversion of the lead containing 2-2-1-2 into the 2-2-2-3 phase (R. Flukiger et al, Superconducting Science and Technology 10(1997) A68–A92.

Those powders commonly considered for use as precursors can be manufactured by a number of routes. These include routes starting from solid components, eg the 'mix and grind' process and those routes starting from solutions, eg: citrate gel (U.S. Pat. No. 5,066,636), co-precipitation (U.S. Pat. No. 5,147,848) and spray pyrolysis (GB 8723345).

Although these processes have been applied to the synthesis of superconducting powders there is no systematic procedure for a controlled conversion into the 2-2-2-3 phase of powders produced by any of these routes.

Therfore, there was a need for a method for the synthesis of superconducting powders comprising a controlled conversion into the 2-2-2-3 phase of powders produced.

A solution has been found by a process to manufacture a mixed $Pb_uBi_vSr_wCa_xCu_y$ oxide powder in which a mixed-metal solution is sprayed as a fine mist into a heated reactor between 600° C. and 1200° C. and the collected powder subsequently calcined between 700 ° C. and 850° C. under an atmosphere of between 0.1% oxygen and 21% oxygen for a total heating time at maximum temperature between 4 and 180 hours.

A part of the present invention is a powder prepared according to this process, in which the compositions for this precursor powder is Pb (0.2–0.4) Bi (1.6–2.0) Sr (1.7–2.0) Ca (1.7–2.3) Cu (1.8–3.3) Ox.

The superconducting phase prepared according to the claimed process in which the mixture, as identified by X-ray diffraction techniques, contains one or more than one of the oxides or mixtures of the group $(Bi_{1-s}Pb_s)$ 1.7–2.4 $(Sr_{1-t}Ca_t)$ 2.6–3.3 Cu 1.8–2.2 $O_x$ phase (abbreviated to 2-2-1-2 phase with s=0–0.4, t=0.2–2.0), $(Ca_{1-m}Sr_m)_2PbO_4$ (where m=0–1), $(Sr_{14-w}Ca_w)Cu_{24}O_{41}$ (abbreviated to 14–24 phase with w=0–9), $(Ca_{1-u}Sr_u)_{1-n}CuO_x$ (1-1 phase with n=0–0.3, u=0–0.3), $(Pb_{1-x}Bi_x)$ 2.9–3.4 $(Sr_{1-y}Ca_y)$ 4.7–5.0 Cu 0.7–1.2 $O_z$ (abbreviated to 3-3-2-1 phase with x=0–0.4, v=0–0.5), CuO, (Sr,Ca)O, $(Bi_{1-z}Pb_z)$ 2.0–2.6 (Sr,Ca) 1.4–1.9 Cu 1.8–2.2 $O_x$ (abbreviated to 2-2-0-1 phase with z=0–0.3), $(Ca_{1-p}Sr_p)2CuO_x$ (abbreviated to 2-1 phase with p=0–0.3), $Bi6Sr$ 8.5–rCa 2.5+r$O_x$ (abbreviated to 9-11-5 with r=0.0–2.2) and $(Bi_{1-y}Pb_y)$ 1.8–2.3 Sr 1.6–1.9 Ca 1.6–2.0 Cu 2.6–3.1 $O_x$ (abbreviated to 2-2-2-3 phase with y=0–0.4).

A precursor powder prepared according to this process may contain said phases in which the weight % of these phases, as determined using the Rietveld Method described later, are 2-2-1-2 phase: 60–95%, and/or 2-1 phase: 0–24%, and/or 14–24 phase: 0–20%, and/or 9-11-5 phase. 0–18%, and/or $(Ca_{1-m}Sr_m)_2PbO_4$: 0–15%, and/or 3-3-2-1 phase: 0–14%, and/or CuO: 0–11%, and/or 1-1 phase: 0–10% and/or CaO: 0-7%

A precursor powder prepared according to the Process of the present invention in which the lead, has entered into the 2212 grains is also a matter of this application as well as a precursor powder in which the carbon content of said powder is under 500 ppm and the use of the powders prepared for the manufacture of superconducting artefacts.

In summary an Oxide Precursor Powder from the Pb—Bi—Sr—Ca—Cu—O 2-2-2-3 system can be produced by heat treating powder, produced using the Spray Pyrolysis Process as described in: GB2210605 or EP0681989 between 700° C. and 850° C. in an atmosphere containing between 0.1% and 21% $O_2$. Heat treatment of the pyrolysis powder under controlled conditions produces a powder with a particular phase composition, that is highly homogeneous and has a small particle size distribution, that is inherently more reactive than powders heat treated in the same way but produced using other processes. This is to be demonstrated in the detailed description below.

It has been found by experiments that the powder produced by the spray pyrolysis process and which was further heat treated to produce a precursor offers significant advantages over those produced by the other routes. In particular the precursor produced from spray pyrolysis powder according to the invention is more reactive, conversion to the 2-2-2-3 phase is faster and thereby saves time and cost, over those produced by the other routes. The precursor produced has a more homogeneous phase distribution and smaller primary particle size than those produced by the other methods.

Under controlled conditions the carbon levels in the powder could also be maintained at a low level, under 500 ppm.

The grain growth on calcining the fine grained pyrolysis powder can often result in powders with primary particles not larger than the raw material components used in the solid state manufacturing process.

An important advantage of the present invention is, that a highly homogeneous powder containing a mix of at least five crystalline phases, each with a small primary particle size is received that reacts by forming the 2-2-2-3 superconducting phase faster than those equivalent powders produced using the citrate gel, co-precipitation and solid state techniques (ref Patents: Liu: U.S. Pat. Nos. 5,066,636, 5,147,848). The main advantage is that the user of such powders requires less time to form the required 2-2-2-3 superconducting phase, saving time and cost in manufacturing their artefacts. This is of particular relevance to the 'powder in tube'tape manufactures producing 2-2-2-3 tapes (Sandhage et al, Journal of Materials, Vol 43, No 3, 1991).

Without further elaboration, it is believed that one skilled in the art can, using the preceding description, utilize the present invention to its fullest extent. The preferred specific embodiments and examples are, therefore, to be construed as merely illustrative, and not limitative of the disclosure in any way whatsoever.

The entire disclosures of all applications, patents, and publications cited above and below are hereby incorporated by reference.

The preparation according to the present invention is as follows:

SAMPLE PREPARATIONS (1) Spray Pyrolysis Powder was produced from a mixed nitrate solution of lead, bismuth, strontium, calcium and copper with the nominal ratio: Pb 0.4: Bi 1.7: Sr 1.8: Ca 2.2: Cu 3.2. The nominal concentration corresponded to 100 g mixed-metal oxide per 1000 ml water. For each 100 g of $(Bi_{1.7}PbO_{0.4})Sr_{1.8}Ca_{2.2}Cu_{3.2}O_x$ the following amounts of nitrates were combined: 78.552 g of $Bi(NO_3)_3.5H_2O$, 12.62 g of $Pb(NO_3)_2$, 36.286 g of $Sr(NO_3)_2$, 49.49 g of $Ca(NO_3)_2.4H_2O$, 73.646 g of $Cu(NO_3)_2.3H_2O$.

By using the same method, with the appropriate mixture of raw nitrates, a powder of the nominal composition: Pb 0.33 Bi 1.80 Sr 1.87 Ca 2.00 Cu 3.00 Ox was also produced.

The solution was sprayed into a stainless steel reactor of 80 mm diameter and 1 m long, using a two fluid sprayhead with air feed of 0.34–0.52 bar. The solution was delivered to the sprayhead using a pump and the reactor temperature was between 800° C. and 1000° C. The average droplet size, $d_{50}$, was <2 microns. The resulting powder was collected by passing the exhaust gas stream through a Pall. stainless steel filter with a mesh size of approximately 5 microns. Approximately 400 g of powder was collected over a 24 hour period.

(2) Co-Precipitation Powder was prepared from a nitrate solution corresponding to the same nominal composition as (1).

For each 5 g of $(Bi_{1.7}Pb_{0.4})Sr_{1.8}Ca_{2.2}Cu_{3.2}O_x$ the following amounts of nitrates were combined: 3.9276 g of $Bi(NO_3)_3.5H_2O$, 0.6310 g of $Pb(NO_3)_2$, 1.8143 g of $Sr(NO_3)_2$, 2.4745 g of $Ca(NO_3)_2.4H_2O$, 3.6823 g of $Cu(NO_3)_2.3H_2O$ and 40 ml of nitric acid ($HNO_3$, 1.66M). The metal nitrates were dissolved into nitric acid. 7.3106 g of oxalic acid ($H_2C_2O_4$) was dissolved in 75 ml of ionized water. 11.7426 g of triethylamine ($C_6H_{15}N$) was then added to the solution. The pH value of the triethylamine/oxalic acid solution was 4.3~4.2.

The metal nitrate solution was titrated into triethylamineloxalic acid solution, until all of the metals precipitated out. The final pH value of precipitates was about one.

The sample was then filtered and dried at 80 degrees centigrade and finally heat treated at 200 degrees centigrade for 24 hours.

(3) Citrate Gel Powder was prepared whereby 1 g equivalent of citric acid was added to a nitrate solution, with the same concentration as (1)

For each 5 g of $(Bi_{1.7}Pb_{0.4})Sr_{1.8}Ca_{2.2}Cu_{3.2}O_x$ the following amounts of nitrates were combined: 3.9276 g of $Bi(NO_3)_3.5H_2O$, 0.6310 g of $Pb(NO_3)_2$, 1.8143 g of $Sr(NO_3)_2$, 2.4745 g of $Ca(NO_3)_2.4H_2O$, 3.6823 g of $Cu(NO_3)_2.3H_2O$ and of 10 ml nitric acid ($HNO_3$, 70%)

Metal nitrates were dissolved in nitric acid, ionized water was then added till the total volume of the solution reached 50 ml. 6.7726 g of Citrate acid ($C_6H_8O_x.H_2O$) was added into the metal nitrate solution. Finally we slowly added ethylenediamine ($C_2H_8N_2$, 99%) to the solution until its pH value reach 6. The solution was then heated at 100° C. until a gel forms. and subsequently heat treated at 200 degrees centigrade for 24 hours.

(4) Powders prepared using the conventional solid state route where produced by intimately mixing appropriate amounts of Bismuth Oxide, Lead Oxide, Copper Oxide, Strontium Carbonate and Calcium Carbonate. For each 5 g of $(Bi_{1.7}Pb_{0.4})Sr_{1.8}Ca_{2.2}Cu_{3.2}O_x$ 1.9803 g $Bi_2O_3$, 0.4464 g PbO, 1.3287 g $SrCO_3$, 1.1010 g $CaCO_3$ and 1.2728 g CuO where mixed.

All the above powders are then heat treated together using the following process:

Heat treatment at 730° C. for 24 hours followed by two 24 hour heat treatments at 800° C. and finally four heat treatments at 842° C. In all cases the heating rate of the furnace was 1° C. per minute and the cooling rate was the natural cooling rate of the furnace.

Figure 1B:
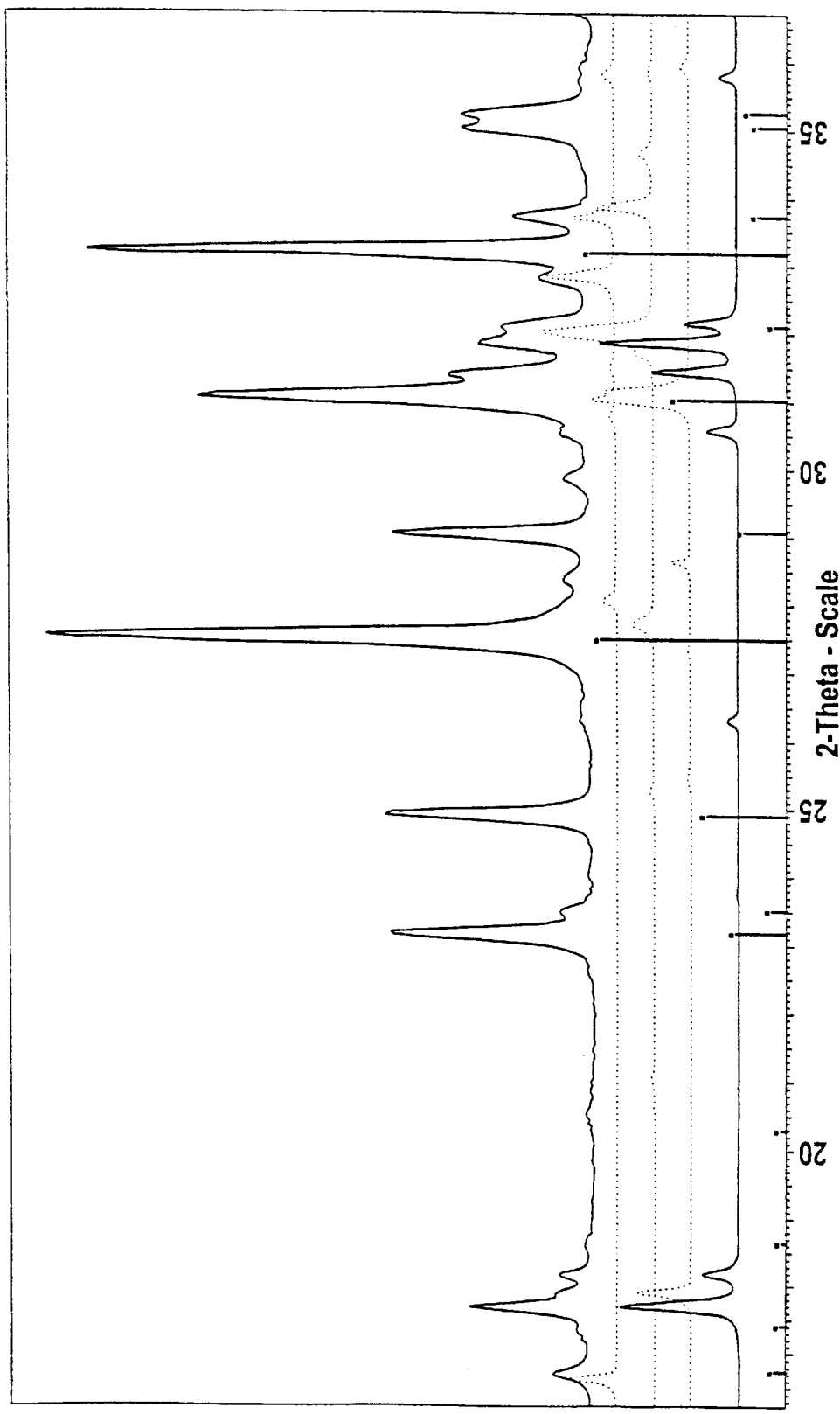

The X-Ray diffraction traces of the precursor powders of nominal composition: $(Bi_{1.7}Pb_{0.4})Sr_{1.8}Ca_{2.2}Cu_{3.2}O_x$ produced are shown in FIGS. 1a and 1b. In the case of the precursor powder produced by Spray Pyrolysis the phases present are the 2-2-1-2 phase, $Ca_2PbO_4$, the 14–24 Phase, the 1-1 phase, CuO and the 3-3-2-1 Phase.

The powders produced by the other methods contain other phases including Copper free phases and significantly more CuO.

Figure 2:
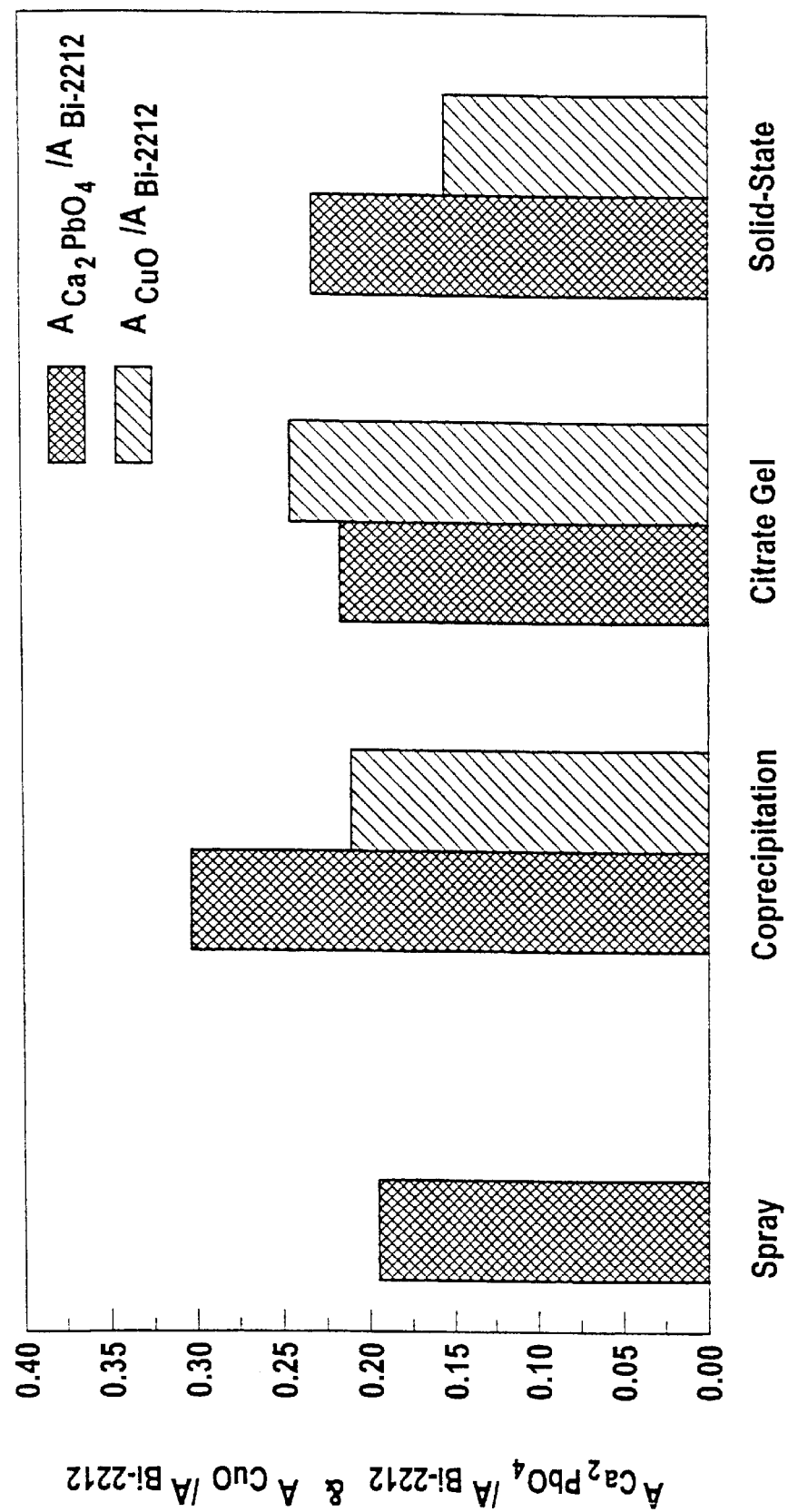

The relative amounts of particular secondary phases can be compared using the X-Ray diffraction data and this is shown in FIG. 2. The precursor produced by Spray Pyrolysis contain very small amounts of Copper Oxide and contains the smallest amount of Calcium Plumbate phase.

The compositions of the powders are shown in Table 1, showing that the powder prepared by co-precipitation is very deficient in strontium and calcium and has excess copper and lead. This was to be expected where precipitation of each component is dependent upon pH.

TABLE 1

Composition of the precursor powders

| Material | ICP (Molar Ratio) | | | | |
|---|---|---|---|---|---|
| | Bi | Pb | Sr | Ca | Cu |
| Expected Composition | 1.70 | 0.40 | 1.80 | 2.20 | 3.20 |
| Spray | 1.69 | 0.38 | 1.78 | 2.18 | 3.30 |
| Co-precipitation | 1.79 | 0.42 | 1.65 | 1.88 | 3.57 |
| Citrate gel | 1.66 | 0.39 | 1.79 | 2.16 | 3.30 |
| Solid-state | 1.68 | 0.39 | 1.79 | 2.20 | 3.23 |

Figure 3A:
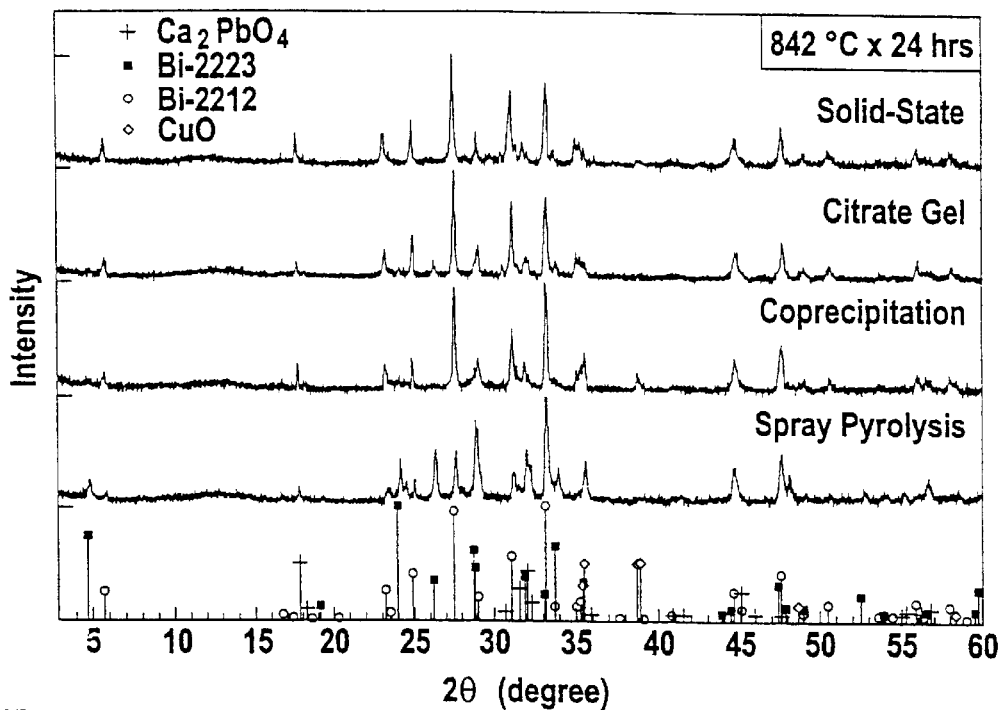

To measure the reactivity of the powder, the development of the final 2-2-2-3 phase was monitored using X-Ray Diffraction. These results can be seen in FIG. 3a and 3b. By comparing the intensities of lines relating to the phases 2-2-2-3 and 2-2-1-2 it is possible to determine the extend of conversion to 2-2-2-3, as shown in FIG. 4. The precursor produced from the Spray Pyrolysis powder converts to the 2-2-2-3 phase much faster than those produces using the other routes.

The reactivity of the powder produced by this method is determined by a number of parameters including the particle size of the starting precursor. In FIG. 5 it is clearly shown that the particle size of the powder produced by the spray pyrolysis powder is finer than those produced using the other methods. Further it has been shown, that the large particles as visible in the micrographs for powders manufactured by the other routes, can be secondary phases, for example calcium plumbate and copper oxide that may take longer to react than if formed as a finer phase.

Another important factor relating to the reactivity is the phase composition of the precursor powder. Precursor Powders produced by the Spray Pyrolysis process vary from the others in having very little or no copper oxide phase, less calcium plumbate phase and significant amounts of $(Sr_{14-y}Ca_y)Cu_{24}O_{41}$ phase. The reduced amount of calcium plumbate phase indicates that substantial amounts of plumbate have already been consumed resulting with lead entering into the Bi—Sr—Ca—Cu—O 2-2-1-2 phase. The particular phase mixture formed in this process, with smaller amounts of calcium plumbate, lead containing-2-2-1-2 and calcium cuprates is ideally suited, as has been demonstrated, to forming the 2-2-2-3 phase much faster than the other phase mixtures.

The phase weight percentages were determined by the Rietveld method according to Hill and Howard (1987) using X-ray diffraction. Commensurate approximations to all crystal structures where used and the structure parameters were fixed to the literature value (Miehe et al, Phsica C 171, 339,1990 for the 2-2-2-3 phase, Petricek et al, Phys. Rev. B 42, 387,1990 for the 2-2-1-2 phase, von Schering et al, Angew. Chem. 100, 4, 1988 for the 2-2-0-1 phase, Teichert and Müller-Buschbaum, Z.anorg. allg. Chem. 607 128, 1992 for the (Sr/Ca)2PbO4 phase, Kim et al, J. Sol. State Chem. 85, 44, 1994 for the 3-3-2-1 phase, Babu and Greaves, Mat. Res. Bull. 26, 499, 1991 for the 1-1 phase, Siegrist et al, Mat. Res. Bull 23, 1429, 1988 for the 14–24 phase, Heinau et al, Z. Krist 209, 418, 1994 for the 2-1 phase, Asbrink and Lorrby Acta, Cryst B 26, 8, 1970 for CuOI, Primak et al, J. Am. Chem. Soc. 70, 2043, 1948 for (Sr,Ca)O and a revised version of Luhrs et al, Chem. Matters. 10, 7, 1875, 1998 for the 9-11-5 phase) Refined parameters were the lattice constants, Pseudo-Voight peak profile parameters including [uvw] description of peak width, 2-2-1-2 grain alignment using the March Model and an overall temperature factor. Microabsorption effects were neglected.

The advantageous results received according to the present invention are shown in FIGS. 1a–5.

FIG. 1a: X-Ray diffraction traces of the precursor powders

FIG. 1b: XRD trace showing the positions of the, various phases present in the powder diagram: vertical lines=2-2-1-2 phase (Pdf Card 40-0378; line 1=Calcium Plumbate ($CA_2PbO_4$); line 2: 3-3-2-1 phase; line 3: $Ca_7Sr_7Cu_{24}O_{41}$, line 4: $Ca_{0.83}CuO_2$ FIG. 2: The relative intensities of the calcium plumbate and copper oxide peaks as seen in the X-Ray diffractogram FIG. 3a: XRD diagram of the Phase Development after 24 hours at 842° C.

Figure 3B:
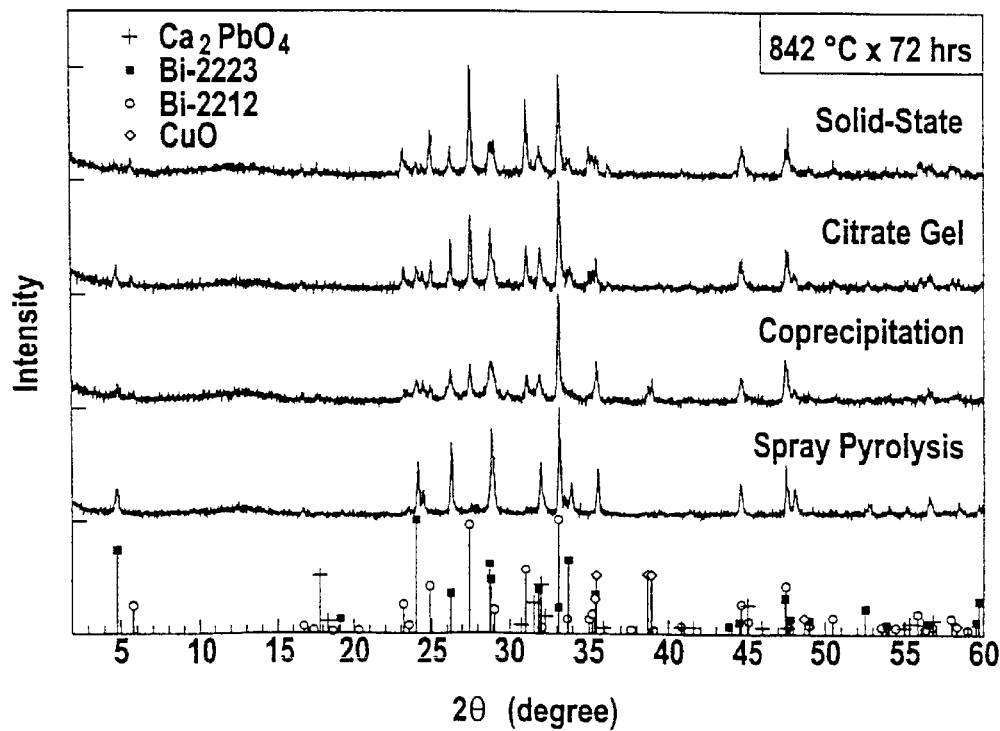
Figure 4:
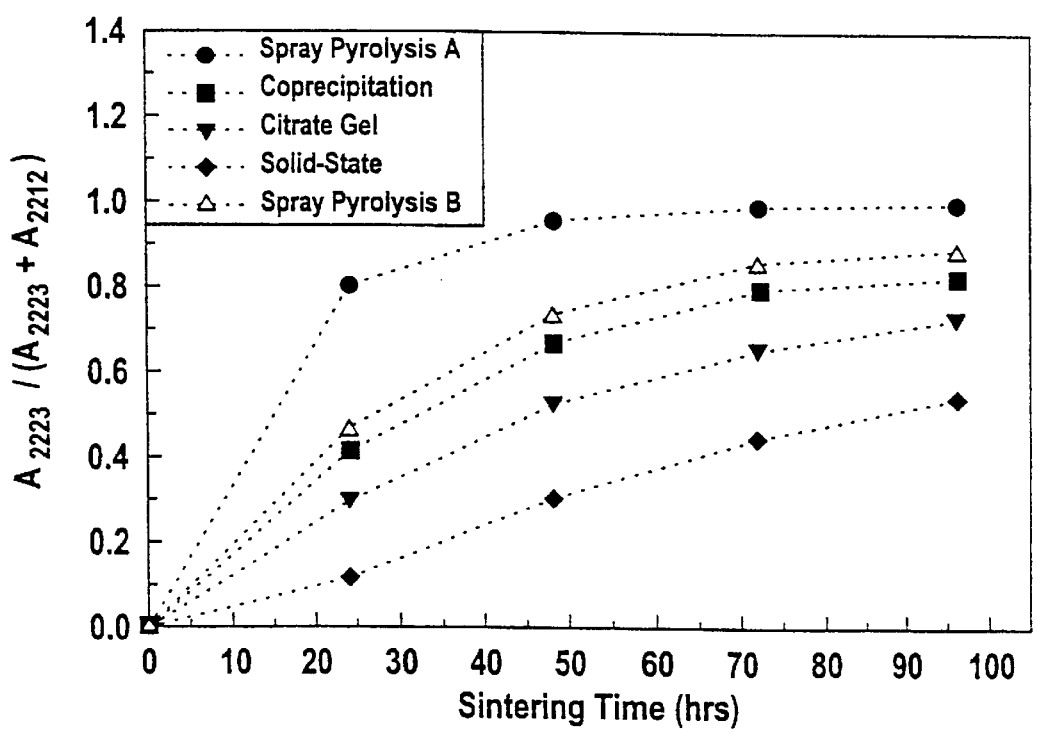

FIG. 3b: XRD diagram of the Phase Development after 72 hours at 842° C.

FIG. 4: The phase formation of Bi-2-2-2-3 with sintering hours. $A_{2-2-2-3}$ and $A_{2-2-1-2}$ denote the areas of the diffraction peaks of Bi-2-2-2-3 (0010) and Bi-2-2-1-2 (008) phases, respectively. The nominal composition of Merck A is $(Bi_{1.7}Pb_{0.4})Sr_{1.8}Ca_{2.2}Cu_{3.2}O_x$ and Merck B is $(Bi_{1.8}Pb_{0.33})Sr_{1.87}Ca_2Cu_3O_x$.

Figure 5A:
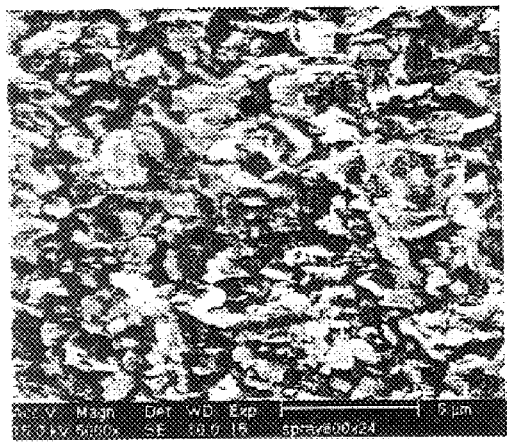

FIG. 5a: Scanning Electron Micrographs of Powder prepared using spray pyrolysis

Figure 5B:
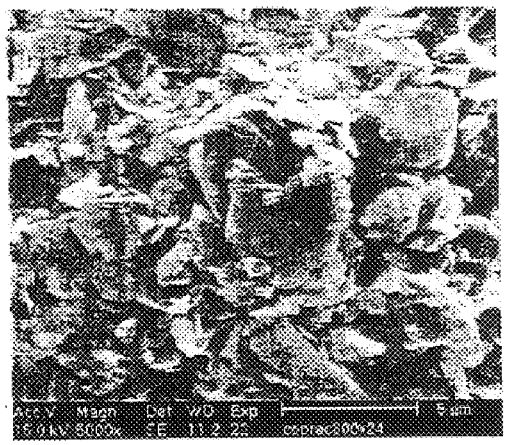

FIG. 5b: Scanning Electron Micrographs of Powder prepared using coprecipitation

Figure 5C:
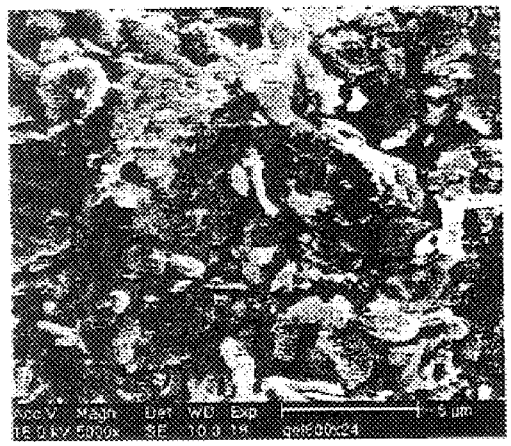

FIG. 5c: Scanning Electron Micrographs of Powder prepared using citrate gel

Figure 5D:
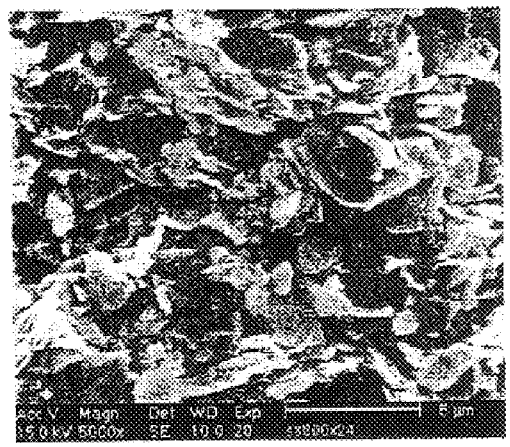

FIG. 5d: Scanning Electron Micrographs of Powder prepared using solid state.

What is claimed is:

1. An oxide precursor powder of the formula having $Pb_{(0.2-0.4)}Bi_{(1.6-2.0)}Sr_{(1.7-2.0)}Ca_{(1.7-2.3)}Cu_{(1.8-3.3)}O_x$, having phase comprising one or more than one of oxides or mixtures of the group $(Bi_{1-s}Pb_s)_{1.7-2.4}(Sr_{1-t}Ca_t)_{2.6-3.3}Cu_{1.8-2.2}O_x$ phase, abbreviated to 2-2-1-2 phase with s=0–0.4, t=0.4–2.0, $(Ca_{1-m}Sr_m)_2PbO_4$ (where m=0–1), $(Sr_{14-w}Ca_w)Cu_{24}O_{41}$, abbreviated to 14–24 phase with w=0–9, $(Ca_{1-u}Sr_u)_{1-n}CuO_x$, 1-1 phase with n=0–0.3, u=0–0.3, $(Pb_{1-x}Bi_x)_{2.9-3.4}(Sr_{1-y}Ca_y)_{4.7-5.0}Cu_{0.7-1.2}O_z$, abbreviated to 3-3-2-1 phase with x=0–0.4, y=0–0.5, CuO, (Sr,Ca)O, $(Bi_{1-z}Pb_z)_{2.0-2.6}(Sr,Ca)_{1.4-1.9}Cu_{1.8-2.2}O_x$, abbreviated to 2-2-0-1 phase with z=0–0.3, $(Ca_{1-p}Sr_p)_2O_x$, abbreviated to 2-1 phase with p=0–0.3, $Bi_6Sr_{8.5-r}Ca_{2.5+r}O_x$, abbreviated to 9-11-5 with r=0.0–2.2, and $(Bi_{1-y}Pb_y)_{1.8-2.3}Sr_{1.6-1.9}Ca_{1.6-2.0}Cu_{2.6-3.1}O_x$, abbreviated to 2-2-2-3 phase with y=0–0.4, prepared in a process in which a mixed-metal solution is sprayed as a fine mist into a heated reactor between 600° C. and 1200° C. and the collected powder subsequently calcined between 700° C. and 850° C. under an atmosphere of between 0.1% oxygen and 21% oxygen for a total heating time at maximum temperature between 4 and 180 hours to yield the oxide precursor powder.

2. An oxide precursor powder according to claim 1, in which the weight percents of phases are 2-2-1-2 phase: 60–95%, and 2-1 phase: 0–24%, and 14–24 phase 0–20%, and 9-11-5 phase: 0–18%, and $(Ca_{1-m}Sr_m)_2PbO_4$: 0–15%, and 3-3-2-1 phase: 0–14%, and CuO: 0–11%, and 1-1 phase: 0–10 % and CaO: 0–7%.

3. An oxide precursor powder prepared according to claim 1 not containing phases free of copper oxide or copper.

4. An oxide precursor powder according to claim 1 which the lead has entered into 2-2-1-2 gains.

5. An oxide precursor powder according to claim 1 in which the carbon content of said powder is under 500 ppm.

6. An oxide precursor powder according to claim 1 comprising the 2-2-2-3 phase.

7. An oxide precursor powder according to claim 1 in which the average primary particle size is between 1–4 microns.

8. A process for manufacturing a super-conducting artefact comprising mechanically deforming and thermally treating an oxide precursor powder according to claim 1.

* * * * *

UNITED STATES PATENT AND TRADEMARK OFFICE
CERTIFICATE OF CORRECTION

PATENT NO.   : 6,677,278 B1
DATED        : January 13, 2004
INVENTOR(S)  : Lee Woodall et al.

It is certified that error appears in the above-identified patent and that said Letters Patent is hereby corrected as shown below:

<u>Title page,</u>
Item [75], Inventors, reads "Bochum (DE)," should read -- Seville (SP) --

<u>Column 7,</u>
Line 35, after "phase," insert word -- mixtures --

<u>Column 8,</u>
Line 19, reads "phase," should read -- phase: --
Line 25, reads "which," should read -- in which --
Line 26, reads "gains," should read -- grains --

Signed and Sealed this

Twenty-fourth Day of August, 2004

JON W. DUDAS
*Director of the United States Patent and Trademark Office*